US009093761B1

(12) United States Patent
Wu

(10) Patent No.: US 9,093,761 B1
(45) Date of Patent: Jul. 28, 2015

(54) TERMINAL BLOCK STRUCTURE

(71) Applicant: DINKLE ENTERPRISE CO., LTD., New Taipei (TW)

(72) Inventor: Shang Tsai Wu, New Taipei (TW)

(73) Assignee: DINKLE ENTERPRISE CO., LTD., New Taipei (TW)

(*) Notice: Subject to any disclaimer, the term of this patent is extended or adjusted under 35 U.S.C. 154(b) by 0 days.

(21) Appl. No.: 14/205,506

(22) Filed: Mar. 12, 2014

(51) Int. Cl.
*H01L 23/48* (2006.01)
*H01R 4/42* (2006.01)

(52) U.S. Cl.
CPC ........................................ *H01R 4/42* (2013.01)

(58) Field of Classification Search
CPC ........................................................ H01R 4/42
USPC ......................................... 439/637, 709, 810
See application file for complete search history.

(56) References Cited

U.S. PATENT DOCUMENTS

| | | | | |
|---|---|---|---|---|
| 4,180,305 A * | 12/1979 | Ustin et al. | .................... | 439/717 |
| 7,048,591 B1 * | 5/2006 | Chiang | ......................... | 439/709 |
| 7,559,810 B1 * | 7/2009 | Wu | ............................... | 439/801 |
| 2008/0142948 A1 * | 6/2008 | Matsumoto | .................. | 257/690 |

* cited by examiner

*Primary Examiner* — Long K Tran

(74) *Attorney, Agent, or Firm* — Birch, Stewart, Kolasch & Birch, LLP

(57) ABSTRACT

The improved terminal block structure comprises a body, a lower terminal base, an upper terminal base, and an elastic component. The lower terminal base is vertically configured in an opening slot of the body, and the lower terminal base comprises a stopper; the upper terminal base vertically slides in the opening slot and vertically slides with respect to the lower terminal base, the orientation of a screw component of the upper terminal base corresponds to a tapped hole of the lower terminal base, and the upper terminal base comprises an another stopper and the orientation of which corresponds to the stopper; and the elastic component is vertically configured in the opening slot and pushing against the body and the upper terminal base from between, and provides an elastic prestress for the upper terminal base to vertically slide with respect to the lower terminal base.

5 Claims, 5 Drawing Sheets

TERMINAL BLOCK STRUCTURE

BACKGROUND OF THE INVENTION

1. Field of the Invention

The invention relates to an improved terminal block structure, and more particularly, to an improved terminal block structure to enhance convenience in usage and effectively reduce working time relatively.

2. Description of the Related Art

A terminal block is an electronic component widely used in various machines which may be used to connect power lines, control lines, data transmission lines, etc.

Common terminal blocks used for connecting wires include a body, an upper terminal base, and a lower terminal base, wherein the lower terminal base is configured in an opening slot of the body and the upper terminal base is configured to slide into the opening slot and slide with respect to the lower terminal base.

When using, that is, when connecting wires, the terminal of the terminal wire (e.g., O-type terminal, Y-type terminal, etc.) is inserted between the upper terminal base and the lower terminal base; subsequently, the upper terminal base is pressed down by a tool such as a screw driver and a screw component (screw) of the upper terminal base is screwed into a tapped hole of the lower terminal base at the same time, and thusly the terminal is clamped between the upper terminal base and the lower terminal base and the purpose of connecting the terminal wire is accomplished. On the other hand, the screw component may be loosened for retracting the terminal.

However, when the screw component of the upper terminal base is loosened in conventional terminal blocks, there exists an issue of the upper terminal base being dislocated with respect to the body and the lower terminal base; therefore, when attempting to connect again for usage, the dislocated upper terminal base needs to be retracted and aligned with the lower terminal base to carry out the screwing, which is extremely inconvenient to use and relatively increases working time and is not ideal.

BRIEF SUMMARY OF THE INVENTION

The present invention relates to an improved terminal block structure, wherein the improved terminal block structure comprises a body, at least one lower terminal base, at least one upper terminal base, and at least one elastic component.

Among which the body is vertically configured with at least one opening slot; the at least one lower terminal base is vertically configured in the at least one opening slot, wherein a pin vertically extends from the at least one lower terminal base and a terminal surface horizontally extends on the at least one lower terminal base, wherein the pin extends outside the body and a tapped hole is configured to open vertically on the terminal surface, and wherein the at least one lower terminal base comprises at least one stopper; the at least one upper terminal base is configured to vertically slide in the at least one opening slot and to vertically slide with respect to the at least one lower terminal base, wherein the at least one upper terminal base comprises a screw component and at least one another stopper, and wherein the orientation of the screw component corresponds to the tapped hole and the orientation of the at least one another stopper corresponds to the at least one stopper; and the at least one elastic component is vertically configured in the at least one opening slot and pushing against the body and the at least one upper terminal base from between, wherein the at least one elastic component provides an elastic prestress for the at least one upper terminal base to vertically slide with respect to the at least one lower terminal base.

Therefore, by the structure design in above, the purpose of enhancing convenience in usage and effectively reducing working time relatively may be accomplished.

In other words, when at least one upper terminal base is loosened, the orientation of the at least one another stopper of the at least one upper terminal base corresponds to the at least one stopper of the at least one lower terminal base and is stopped by it, and thusly the issue of the at least one upper terminal base being dislocated with respect to the body and the at least one lower terminal base does not occur, which means the extreme inconvenience in usage of conventional terminal blocks mentioned in above does not occur.

The at least one stopper is an engaging flange and the at least one another stopper is an engaging hook in above.

A pole vertically extends from the at least one upper terminal base, and the at least one elastic component is a spring encircling the pole in above.

A containing slot is configured in the at least one opening slot of the body, and the pole and the spring is located in the containing slot in above.

At least one directing slot is configured in the at least one opening slot of the body, and at least one directing protrusion is configured to protrude from the at least one upper terminal base, and the at least one directing protrusion is configured to slide correspondingly in the at least one directing slot in above.

DETAILED DESCRIPTION OF THE INVENTION

Figure 1:
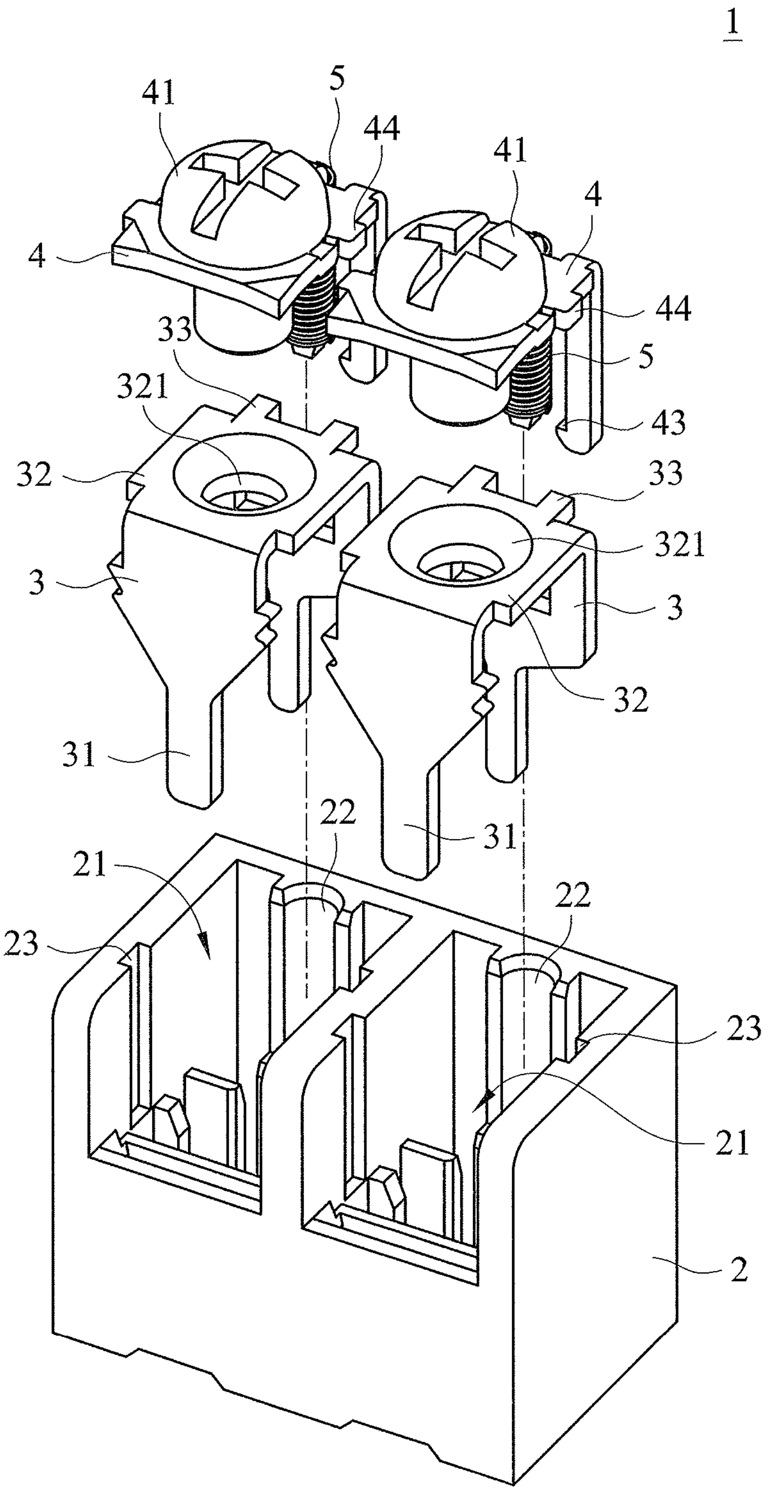
FIG. 1 is a three-dimensional-view drawing according to a preferred embodiment of the invention.
Figure 2:
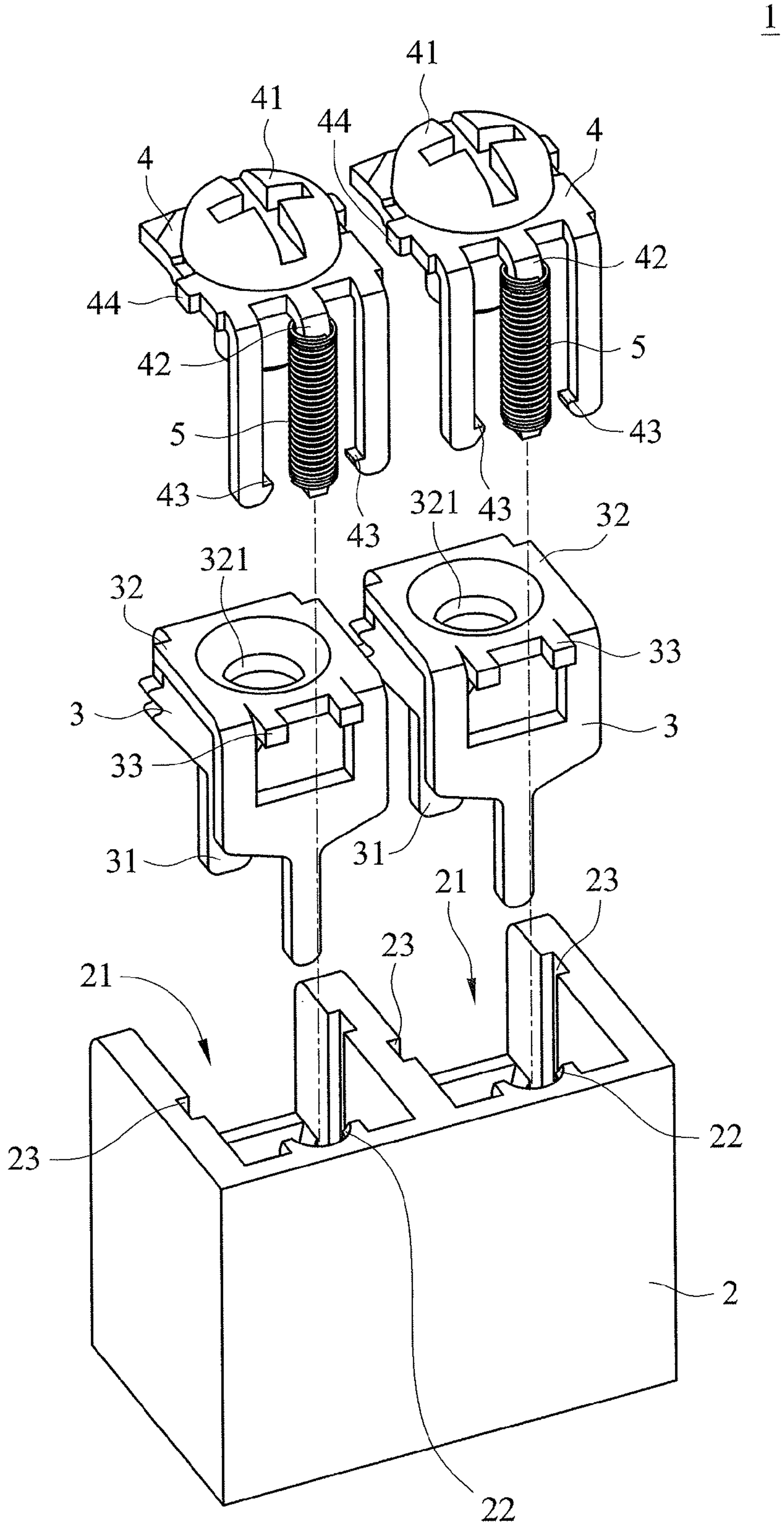
FIG. 2 is a three-dimensional-view drawing from another view angle according to a preferred embodiment of the invention.

Please refer to both FIG. 1 and FIG. 2, wherein FIG. 1 is a three-dimensional-view drawing according to a preferred embodiment of the invention and FIG. 2 is a three-dimensional-view drawing from another view angle according to a preferred embodiment of the invention.

FIG. 1 and FIG. 2 show an improved terminal block structure 1, wherein the improved terminal block structure 1 comprises a body 2, at least one lower terminal base 3, at least one upper terminal base 4, and at least one elastic component 5.

As shown in FIG. 1 and FIG. 2, the body 2 is vertically configured with at least one opening slot 21; at least one lower terminal base 3 is vertically configured in the at least one opening slot 21 of the body 2, wherein a pin 31 vertically extends from the at least one lower terminal base 3 and a terminal surface 32 horizontally extends on the at least one lower terminal base 3, wherein the pin 31 extends outside (beyond) the body 2 and a tapped hole 321 is configured to open vertically on the terminal surface 32, and wherein the at least one lower terminal base 3 comprises at least one stopper 33; at least one upper terminal base 4 is configured to vertically slide in the at least one opening slot 21 of the body 2 and to vertically slide with respect to the at least one lower terminal base 3, wherein the at least one upper terminal base 4 comprises a screw component 41 and at least one another stopper 43, and wherein the orientation of the screw component 41 corresponds to the tapped hole 321 and the orientation of the at least one another stopper 43 corresponds to the at least one stopper 33; and at least one elastic component 5 is vertically configured in the at least one opening slot 21 of the body 2 and pushing against the body 2 and the at least one upper terminal base 4 from between, wherein the at least one elastic component 5 provides an elastic prestress for the at least one upper terminal base 4 to vertically slide with respect to the at least one lower terminal base 3.

In one embodiment, as shown in FIG. 1 and FIG. 2, the number of the at least one lower terminal base 3, at least one upper terminal base 4, at least one elastic component 5, and the at least one opening slot 21 is depicted as two in the figures, but the invention is not limited thereto; the number of the above components may be correspondingly designed as one, three, or more depending on the actual needs.

Figure 3:
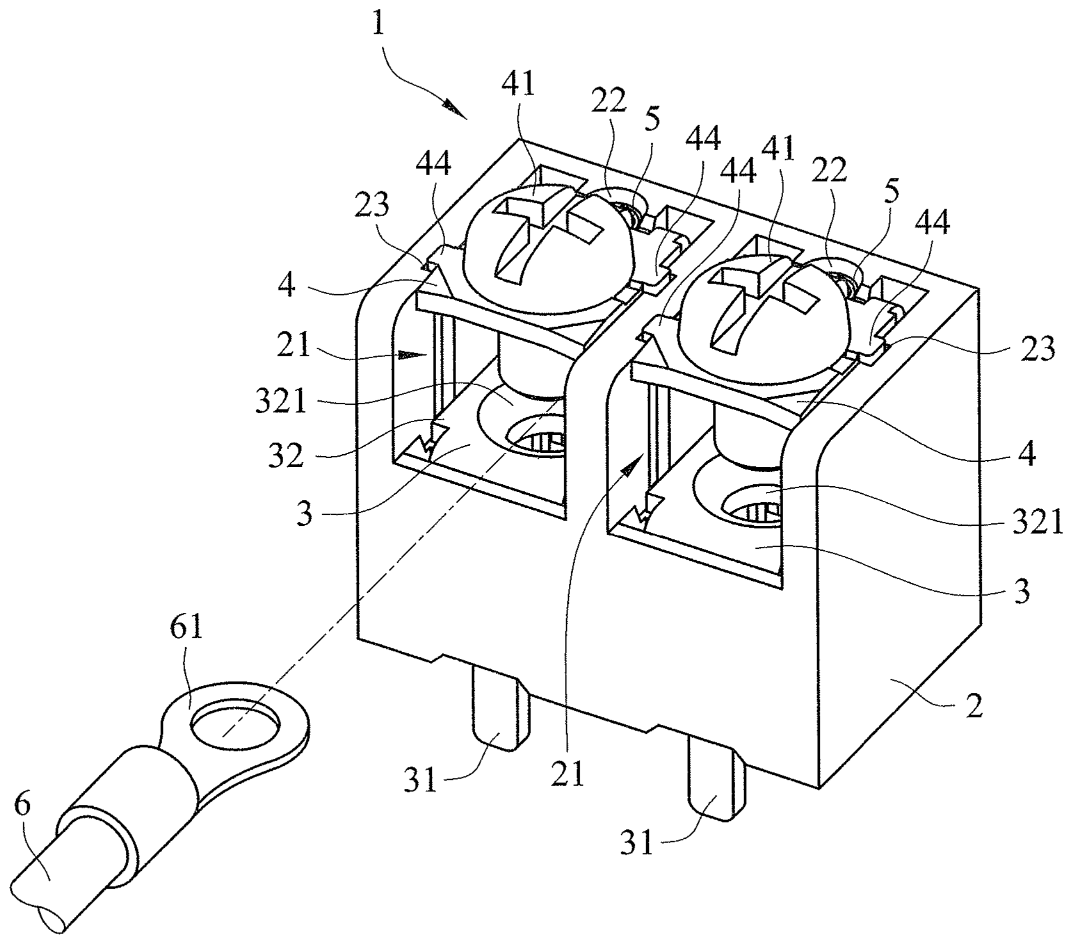
FIG. 3 is a schematic diagram of the state in usage according to a preferred embodiment of the invention.
Figure 4:
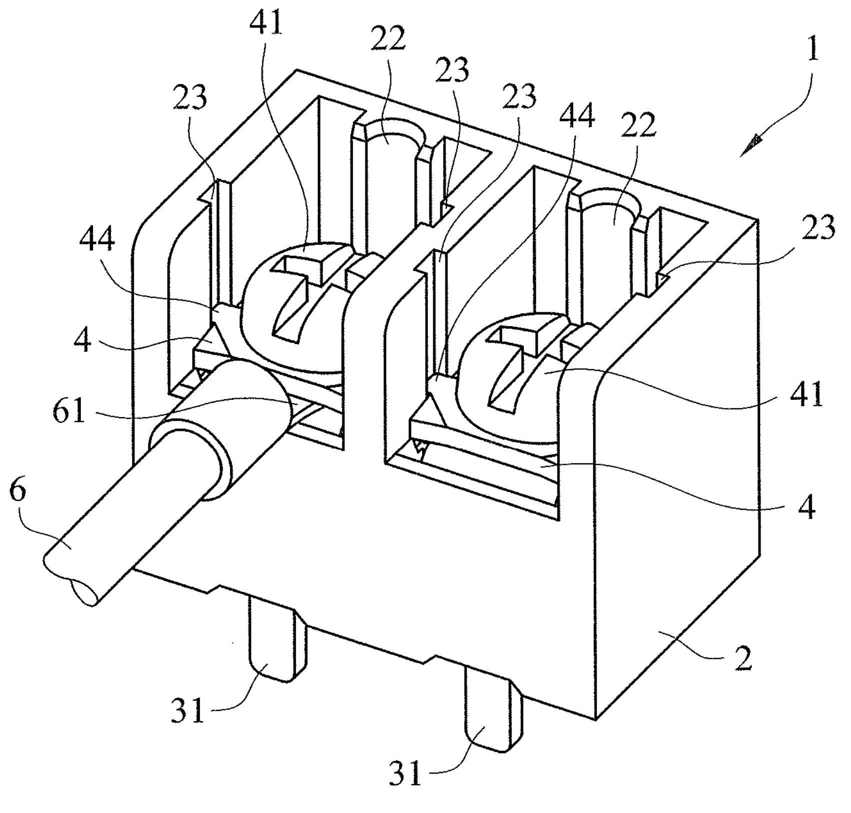
FIG. 4 is another schematic diagram of the state in usage according to a preferred embodiment of the invention.

Please refer to both FIG. 3 and FIG. 4, wherein FIG. 3 is a schematic diagram of the state in usage according to a preferred embodiment of the invention and FIG. 4 is another schematic diagram of the state in usage according to a preferred embodiment of the invention.

When using, that is, when connecting wires, the terminal wire 6 is inserted between the lower terminal base 3 and the upper terminal base 4, as shown in FIG. 3, and the O-type terminal 61 (the O-type terminal is used as an example in this embodiment; other types of terminals such as Y-type terminals may certainly be used as well) of the terminal wire 6 is inserted between the lower terminal base 3 and the upper terminal base 4. Subsequently, as shown in FIG. 4, the upper terminal base 4 is pressed down by a tool such as a flat-head screw driver or a cross-head screw driver (not shown) to vertically slide downwards with respect to the lower terminal base 3, and the screw component 41 with an orientation corresponding to the tapped hole 321 is screwed into the tapped hole 321 at the same time, and thusly the O-type terminal 61 is clamped between the upper terminal base 4 and the lower terminal base 3 and the purpose of connecting the terminal wire 6 is accomplished.

On the other hand, when retracting the terminal wire 6, that is, when dislocating the O-type terminal 61 from the upper terminal base 4 and the lower terminal base 3, a flat-head screw driver or a cross-head screw driver (not shown) is only required to similarly loosen the screw component 41; during this time, the elastic component 5 provides an elastic prestress for the upper terminal base 4 to vertically slide with respect to the lower terminal base 3, and therefore at the same time of being loosened, the elastic prestress of the elastic component 5 pushes against the upper terminal base 4 to vertically slide upwards so that the upper terminal base 4 gradually slides upwards to leave the lower terminal base 3, and the screw component 41 disengages with the tapped hole 321 and the O-type terminal 61 may be dislocated from the upper terminal base 4 and the lower terminal base 3 to retract the terminal wire 6.

Figure 5:
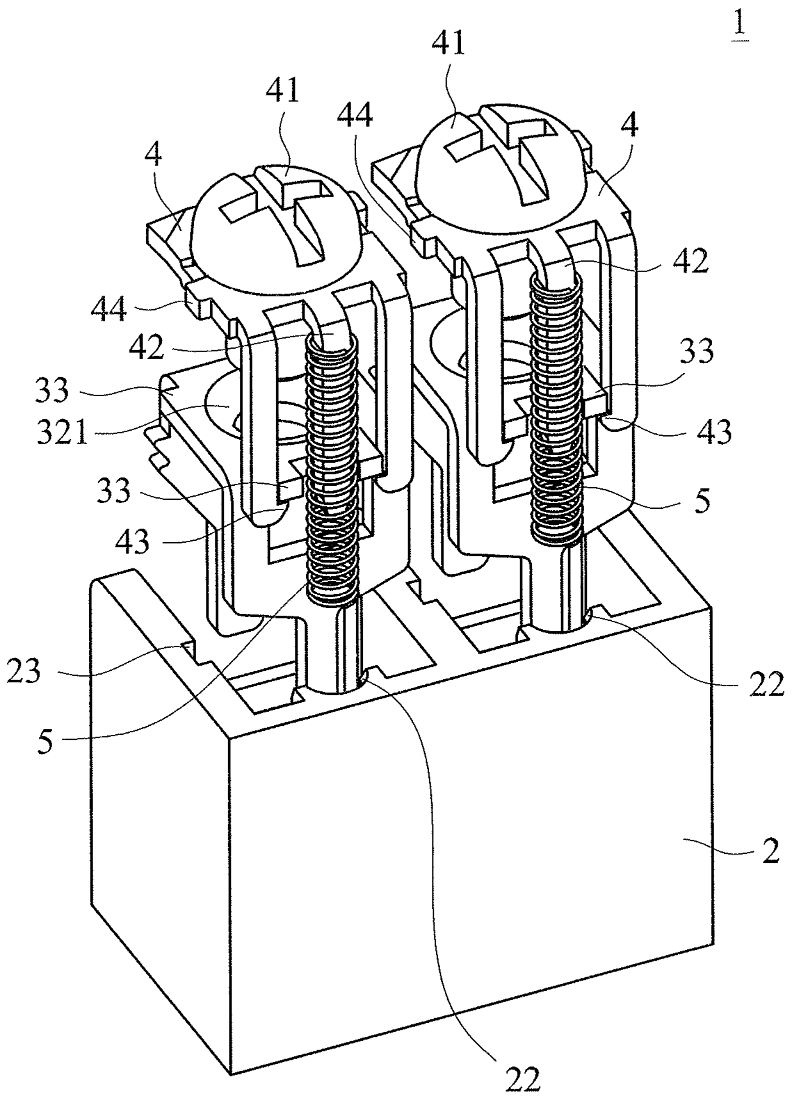
FIG. 5 is a schematic diagram of the state of engagement of the upper terminal base and the lower terminal base according to a preferred embodiment of the invention.

Please refer to FIG. 5 which is a schematic diagram of the state of engagement of the upper terminal base and the lower terminal base according to a preferred embodiment of the invention. During the above process of retracting the terminal wire 6, as mentioned in above, the elastic prestress of the elastic component 5 pushes against the upper terminal base 4 to vertically slide upwards so that the upper terminal base 4 gradually slides upwards to leave the lower terminal base 3; meanwhile, the orientation of the another stopper 43 of the upper terminal base 4 corresponds to the stopper 33 of the lower terminal base 3, which means when the upper terminal base 4 gradually slides upwards to leave the lower terminal base 3 for a certain distance under the elastic prestress of the elastic component 5, the another stopper 43 of the upper terminal base 4 is correspondingly engaged with and stopped by the stopper 33 of the lower terminal base 3. In other words, during the operation of gradually sliding the upper terminal base 4 upwards to leave the lower terminal base 3 to retract the terminal wire 6, the issue of the upper terminal base 4 being dislocated with respect to the body 2 and the lower terminal base 3 does not occur, and when attempting to connect again for usage, the upper terminal base 4 may be directly pressed down to vertically slide downwards with respect to the lower terminal base 3 and the screw component 41 may be screwed into the tapped hole 321 at the same time; therefore, in addition to preventing the aforementioned dislocation issue, the convenience in usage is relatively enhanced and subsequently the working time is effectively reduced.

Please again refer to FIG. 2, in one embodiment, the stopper 33 of the lower terminal base 3 is an engaging flange and the another stopper 43 of the upper terminal base 4 is an engaging hook, and the engaging hook and the engaging flange may correspondingly engage and stop.

Also shown in FIG. 2, in one embodiment, a pole 42 vertically extends from the upper terminal base 4, and the elastic component 5 is a spring encircling the pole 42. Needless to say, the structure design may be modified depending on actual needs; for example, the elastic component 5 may be a spring leaf and the pole 42 may not be required in the design.

Also shown in FIG. 2, in one embodiment, a containing slot 22 is configured in the opening slot 21 of the body 2, and the aforementioned pole 42 and the spring is located in the containing slot 22.

Please again refer to both FIG. 3 and FIG. 4, in one embodiment, at least one directing slot 23 is configured in the opening slot 21 of the body 2, and at least one directing protrusion 44 is configured to protrude from the upper terminal base 4, and the at least one directing protrusion 44 is configured to slide correspondingly in the at least one directing slot 23.

In this embodiment, FIG. 3 and FIG. 4 shows a directing slot 23 configured on each of the two opposite sides of the opening slot 21 of the body 2, and a directing protrusion 44 is configured to protrude from each of the two opposite sides of the upper terminal base 4, and each of the two directing protrusions 44 is configured to slide correspondingly in the corresponding one of the two directing slots 23. Needless to say, the number and designed position of the directing slot 23 and the directing protrusion 44 may be modified depending on actual needs.

What is claimed is:

1. An improved terminal block structure, comprising:

a body, vertically configured with at least one opening slot;

at least one lower terminal base, vertically configured in the at least one opening slot, wherein a pin vertically extends from the at least one lower terminal base and a terminal surface horizontally extends on the at least one lower terminal base, wherein the pin extends outside the body and a tapped hole is configured to open vertically on the terminal surface, and wherein the at least one lower terminal base comprises at least one stopper;

at least one upper terminal base, configured to vertically slide in the at least one opening slot and to vertically slide with respect to the at least one lower terminal base, wherein the at least one upper terminal base comprises a screw component and at least one another stopper, and wherein the orientation of the screw component corresponds to the tapped hole and the orientation of the at least one another stopper corresponds to the at least one stopper; and at least one elastic component, vertically configured in the at least one opening slot and pushing against the body and the at least one upper terminal base from between, wherein the at least one elastic component provides an elastic prestress for the at least one upper terminal base to vertically slide with respect to the at least one lower terminal base.

2. The improved terminal block structure as claimed in claim 1, wherein the at least one stopper is an engaging flange and the at least one another stopper is an engaging hook.

3. The improved terminal block structure as claimed in claim 1, wherein a pole vertically extends from the at least one upper terminal base, and wherein the at least one elastic component is a spring encircling the pole.

4. The improved terminal block structure as claimed in claim 3, wherein a containing slot is configured in the at least one opening slot of the body, and wherein the pole and the spring is located in the containing slot.

5. The improved terminal block structure as claimed in claim 1, wherein at least one directing slot is configured in the at least one opening slot of the body, wherein at least one directing protrusion is configured to protrude from the at least one upper terminal base, and wherein the at least one directing protrusion is configured to slide correspondingly in the at least one directing slot.

* * * * *